United States Patent [19]

Kuhara et al.

[11] Patent Number: 4,949,042

[45] Date of Patent: Aug. 14, 1990

[54] MAGNETIC RESONANCE IMAGING SYSTEM

[75] Inventors: Sigehide Kuhara, Yokohama; Shoichi Kanayama, Kawaguchi, both of Japan

[73] Assignee: Kabushiki Kaisha Toshiba, Kawasaki, Japan

[21] Appl. No.: 298,947

[22] Filed: Jan. 19, 1989

[30] Foreign Application Priority Data

Jan. 22, 1988 [JP] Japan .................................. 63-10823
Nov. 26, 1988 [JP] Japan .................................. 63-299330

[51] Int. Cl.$^5$ ............................................ G01R 33/20
[52] U.S. Cl. .................................... 324/311; 324/309; 128/653 A
[58] Field of Search ............... 324/307, 309, 311, 312, 324/314; 128/653

[56] References Cited

U.S. PATENT DOCUMENTS

| | | | |
|---|---|---|---|
| 4,165,479 | 8/1979 | Mansfield | 324/309 |
| 4,451,788 | 5/1984 | Edelstein et al. | 324/309 |
| 4,714,885 | 12/1987 | Paltiel et al. | 324/312 |
| 4,720,679 | 1/1988 | Patrick et al. | 324/312 |
| 4,794,337 | 12/1988 | Twieg | 324/309 |

OTHER PUBLICATIONS

"Simple Proton Spectroscopic Imaging", Radiology 153: pp. 189–194, W. Thomas Dison; 1984.
"Water/Fat Separation and Chemical Shift Artifact Correction Using a Single Scan", SMRM 1985, vol. 1, pp. 174–175; J. L. Patrick et al.
"Fat-Water Separated Images in EIP" SMRM 1988, vol. 1, p. 242; R. Coxon et al.

Primary Examiner—Hezron E. Williams
Assistant Examiner—Kevin D. O'Shea
Attorney, Agent, or Firm—Oblon, Spivak, McClelland, Maier Neustadt

[57] ABSTRACT

A magnetic resonance imaging system is adapted to achieve the imaging of magnetic resonance signals detected from an object by applying a high frequency magnetic field and gradient field to the object in a homogeneous static field in accordance with a predetermined pattern and includes a data pick-up section and image processing section. The data pick-up section is of such a type that, with the use of a predetermined pulse sequence so time-adjusted that a phase difference between two predetermined substances somewhat differing in their magnetic resonance frequency due to a chemical shift is $\pi/2$ or $-\pi/2$ on a predetermined time, picks up all magnetic resonance data necessary for reconstruction of an image of a slice excited by the high frequency field into a magnetic resonance within a period of time in which that predetermined nuclear magnetization of the slice is relaxed due to the relaxation of a transverse magnetization. The image processing section obtains a magnetic resonance image of at least one of the two substances gained, in a manner separated into real and imaginary part of image information, by subjecting mangetic resonance data picked up by the data pick-up section to a two-dimension complex Fourier transformation. It is thus possible to obtain a magnetic resonance image of at least one of the two substances in a very small period of time.

18 Claims, 9 Drawing Sheets

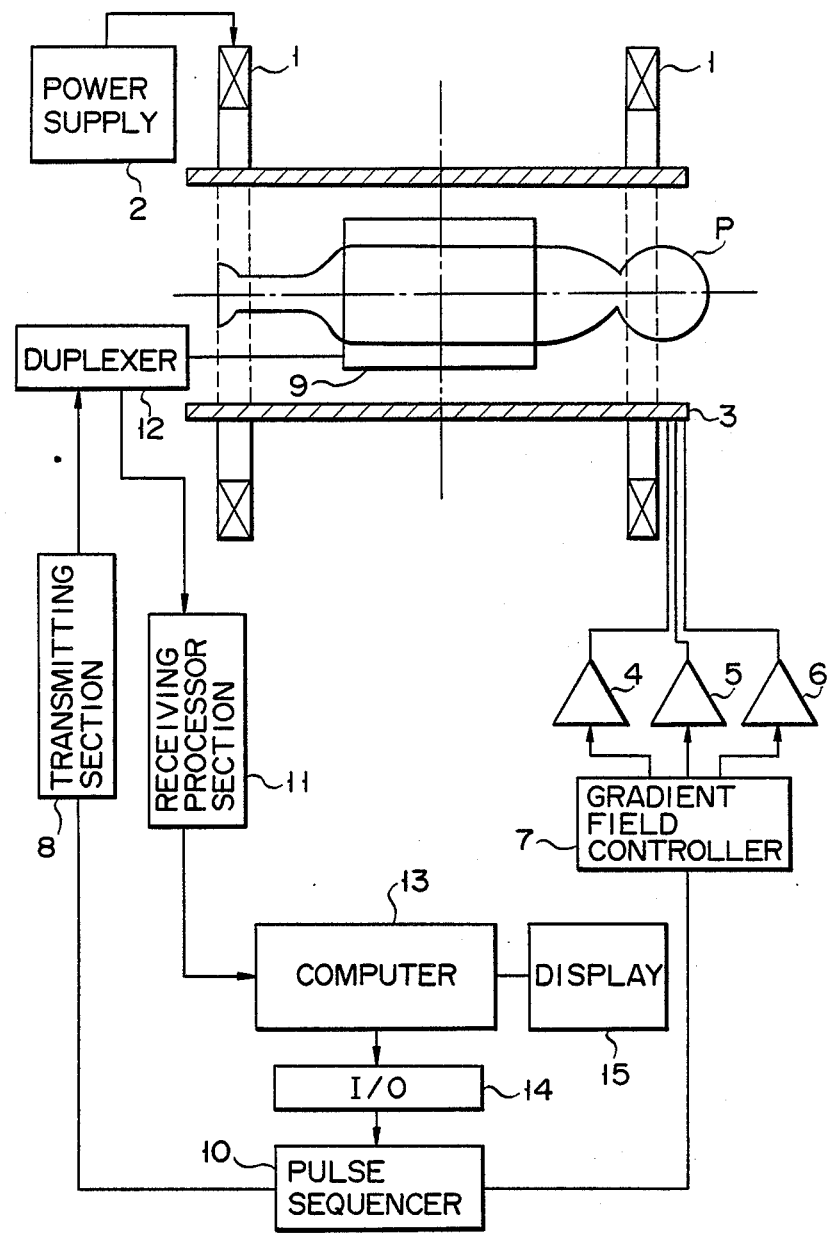
F I G. 4

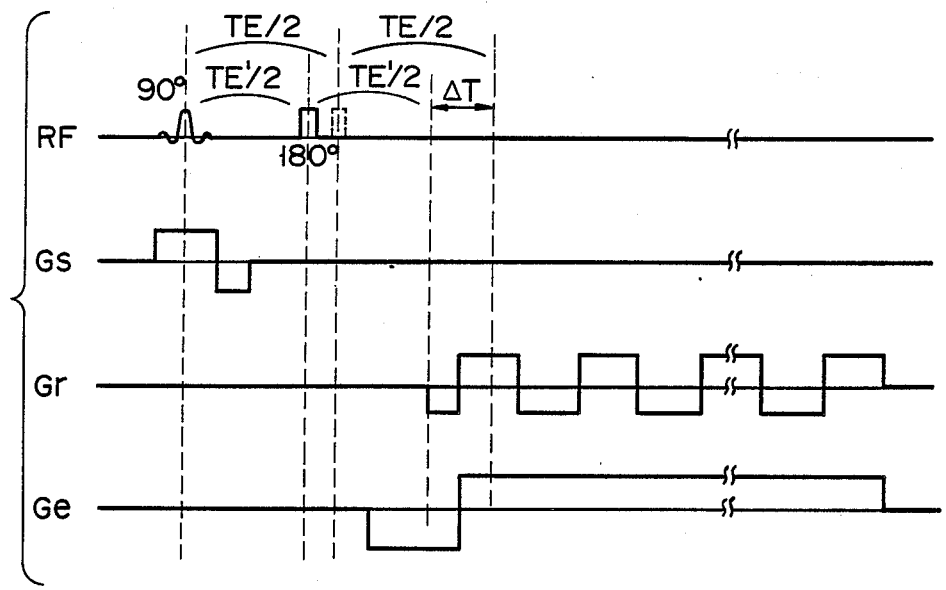
F I G. 5
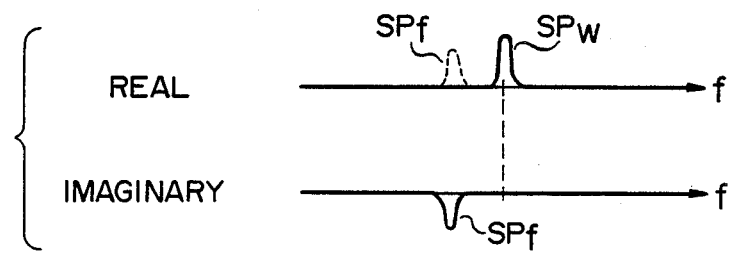
F I G. 6

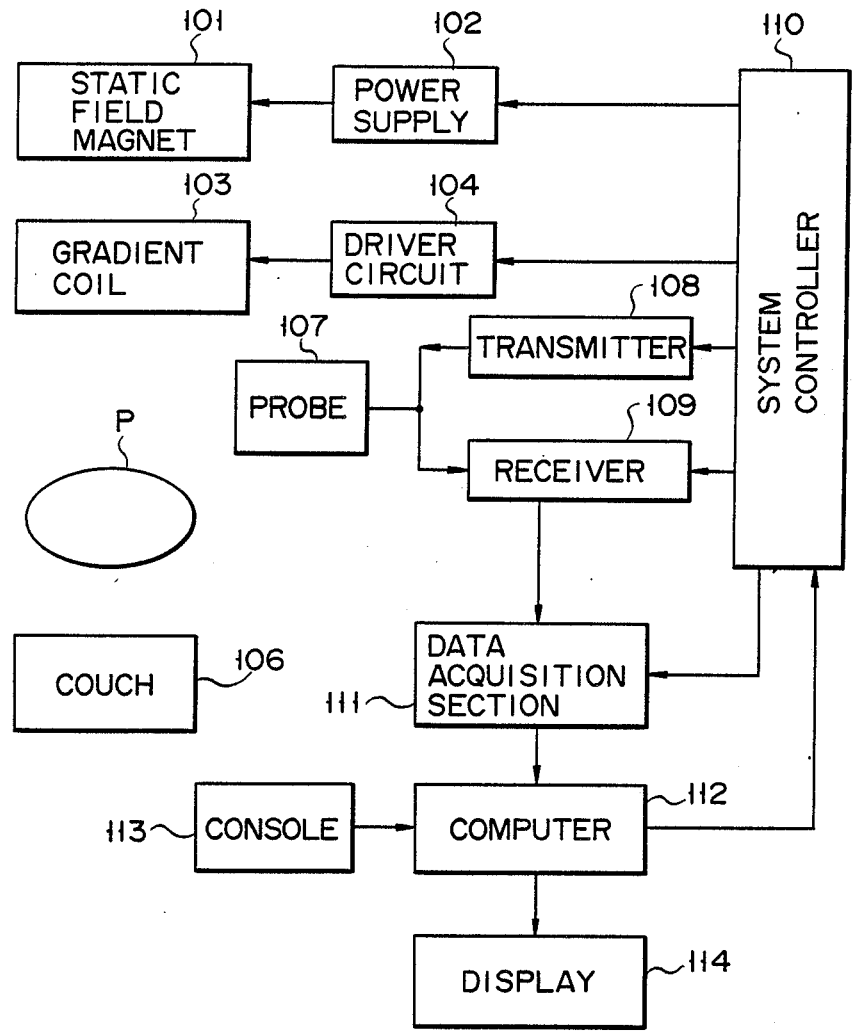
F I G. 7

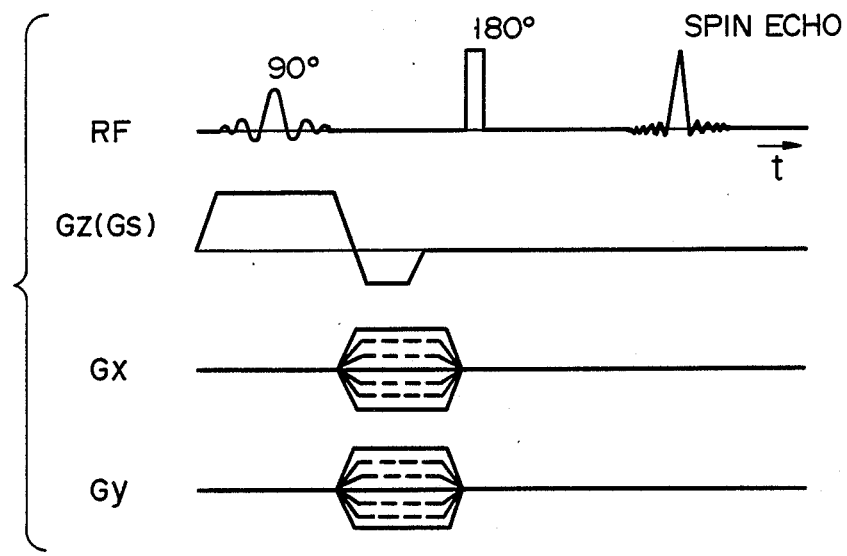
F I G. 12

MAGNETIC RESONANCE IMAGING SYSTEM

BACKGROUND OF THE INVENTION

1. Field of the Invention

The present invention relates to a magnetic resonance imaging (MRI) system and, in particular, to a magnetic imaging system which can obtain separated images of two substances having magnetic resonance frequencies somewhat different in their chemical shift with high speed.

2. Description of the Related Art

As well known in the art, a magnetic resonance (MR) imaging is a technique of imaging the chemical and physical information of molecules, utilizing the phenomenon that when a group of nuclear spins of atoms having their inherent magnetic moment is placed in a homogeneous static magnetic field of strength HO it is possible to resonantly absorb the energy of a high frequency magnetic field rotated at a specific angular speed $\omega = \gamma HO$ within a plane perpendicular to the direction of the static field where Y denotes a gyromagnetic ratio.

As a method for imaging a spatial distribution of specific nuclei, such as the nuclei of hydrogen in water and fat, of an object through the utilization of the magnetic resonance imaging, use is made of a projection reconstruction method by Lauterbur, Fourier transform method by Kumar, Welti and Ernst, spin warp method (modified Fourier transform method, and so on).

The magnetic resonance imaging system for obtaining an image by virtue of a magnetic resonance imaging takes a longer time in the collection of data than the other medical image diagnosing apparatus, e.g., an ultrasonic diagnosing apparatus or X-ray CT (Computer tomography) apparatus. Therefore, an artifact is produced by the movement of the object, e.g., a patient, such as the respiration movement and it is thus difficult to obtain an image of a high-speed moving section or site, such as the heart and circulatory system. Furthermore, the patient experiences great pain during the imaging period due to longer imaging time involved.

As a method for obtaining an image at high speed by a magnetic resonance imaging technique, ultra high-speed imaging methods have been proposed, such as an echo planar method by Mansfield and ultra high-speed Fourier transform method by Hutchison.

In the echo planar method, the magnetic resonance data is collected in accordance with a pulse sequence as shown in FIG. 1.

(1) The magnetization of the slice is selectively excited by applying a 90° high frequency selective excitation pulse as a high frequency magnetic field RF, while applying a slicing gradient magnetic field Gs for the slice.

(2) a 180° high frequency pulse is applied.

(3) A read-out gradient field Gr is applied by a plurality of high-speed switching operations in a direction parallel to the slice plane, while a phase-encoding gradient field Ge is statically applied in a direction parallel to the slice plane and at right angles to the read-out gradient field Gr.

The ultra high-speed Fourier method also referred to as a multiple echo Fourier method is different from the echo planar method of FIG. 1 in that, as shown in FIG. 2, the phase encode gradient field Ge is applied in a pulse-like fashion for each inversion of the read-out gradient field. In other respects, both are similar to each other.

According to these methods, all data necessary for the imaging of the slice can be collected within a time period in which the magnetization of the slice excited by the single 90° high frequency pulse is relaxed by the relaxation of the transverse magnetization, so that it is possible to obtain a high-speed imaging.

However, these ultra high-speed imaging methods pose the problems as will be set forth below.

The excited magnetization in the slice of the object produces a phase dispersion resulting from the spatial inhomogeneities of the static field and hence an apparent transverse relaxation occurs at a time T2* which is shorter than that transverse relaxation time T2. Even if the collection of the magnetic resonance data is to be achieved immediately after the excitation of the magnetization, it is difficult to start data collection at the onset of excitation in terms of the system's characteristics. Hence, there is an unavoidable delay at the start of data collection. A correct image cannot be reconstructed due to the influence of the phase inversion at the time T2*. In the extra high-speed imaging pulse sequence as shown in FIGS. 1 and 2, magnetization is excited by a 90° selective excitation pulse and 180° high frequency pulse is applied to allow the phase of the magnetization which is spatially phase dispersed to be correctly rearranged to collect image data.

In order to obtain a correct magnetization phase this method takes double a time from the excitation of magnetization until the application of a 180° high frequence pulse. The magnetic resonance data collection time and the time required from the 180° pulse application are added to the time (i.e. imaging time) from the excitation of the magnetization until the collection of the magnetic resonance data is completed. That total time offers a bar to the implementation of high-speed imaging.

In the aforementioned ehco-planar and ultra high-speed Fourier transform methods, the intensity of the phase encode gradient field is very small, thus being liable to produce a phase encode error resulting from the spatial or time inhomogeneities of a static field. Such a phase encode error causes a deformation or blurring of an image reconstructed.

A magnetic resonance signal, even if coming from the nuclei of specific atoms in the sample, produces a frequency difference called a "chemical shift" due to a difference in the chemical circumference. The Dixon method is known as the method for obtaining a water and fat separated image through the utilization of the chemical shift. In accordance with the Dixon method, two imaging operations are required in obtaining a water/fat-separated image. In this case, the Dixon method uses the conventional imaging technique and takes a longer time for the respective imaging than the aforementioned ultra high-speed imaging method. Hence it takes longer time to obtain a water/fat-separated image.

FIGS. 3A and 3B show a pulse sequence for obtaining a water/fat-separated image by the Dixon method.

As shown in FIG. 3A, a gradient field Gs for the slice and 90° selective excitation pulse $RF_1$ are applied to the object and, upon applying a 180° pulse $RF_2$ following a time TE/2, the nuclear spin dispersed is brought into an in-phase relation after TE/2, producing an echo. At this time, magnetic resonance signals of the nuclei of hydrogen in water and fat have the same phase. Under these situations, the read-out gradient field Gr is applied, allowing the collection of data for one echo. By repeating these operations a plurality of times while varying little by little the phase encode gradient field Ge, it is possible to collect whole magnetic resonance data necessary for the reconstruction of an image. If the image is reconstructed by the magnetic resonance data thus obtained, then it is possible to get an image corresponding to a sum of the water and fat images, noting that this image contains a chemical shift, that is, a positional displacement corresponding to a difference between the frequence of the water and that of the fat.

As shown in FIG. 3B, the application timing of the 180° pulse $RF_2$ is changed a time $TE'/2$ from a 90° pulse $RF_1$ and magnetic resonance data is collected a time $\Delta T$ after the occurrence of an echo following that time $\Delta T$. At this time, the time $\Delta T$ is so set that a phase difference between the magnetic resonance signals of the nuclei of hydrogen in the water and fat is just 180°. The image reconstructed based on the magnetic resonance data thus obtained corresponds to an image which is a difference of the image of the water and that of the fat. It is thus possible to separate the image of the water and that of the fat by computation from those two reconstructed images.

In the Dixon method, two imaging steps are needed to obtain a water/fat-separated image. If, however, the time $\Delta T$ in the sequence of FIG. 3B is set to a predetermined value, that is, the time at which a phase difference between both the water and the fat signal is $\pi/2$ or $-\pi/2$, then the water and fat image information can be obtained by one imaging operation in a manner separated into a real and an imaginary part of the image data, respectively. The method for obtaining the water/fat-separated image through the utilization of the above is referred to as a modified Dixon method. Even the modified Dixon method employs conventional imaging method which is longer in the imaging process than the ultra high-speed imaging method and hence it takes longer time to obtain a water/fat-separated image.

SUMMARY OF THE INVENTION

It is accordingly the object of the present invention to provide a magnetic resonance imaging system which can obtain, in a brief period of time, a substance/substance-separated image with both the substances somewhat different in their resonance frequency due to their chemical shift.

The magnetic resonance imaging system applies a high frequency magnetic field and gradient field to an object in a homogeneous static magnetic field in a predetermined pulse sequence and detects a magnetic resonance signal from the sample to obtain an image. The magnetic resonance imaging system of the present invention includes a data pick-up section and image processing unit. The data pick-up section uses a predetermined pulse sequence so timed that a nuclear magnetization phase difference between two predetermined substances somewhat differing in their magnetic resonance frequency due to a chemical shift is set to $\pi/2$ or $-\pi/2$ at a predetermined time and acquires all magnetic resonance data necessary to reconstruct an image of a slice excited by the aforementioned high frequency magnetic field into magnetic resonance, within a period of time in which the aforementioned predetermined nuclear magnetization is relaxed by the relaxation of the transverse magnetization. The image processing section obtains a magnetic resonance image of at least one of the two substances as obtained in a form separated into image information's real and imaginary parts by subjecting magnetic resonance data acquired by the data pick-up unit to a two-dimensional complex Fourier transform. In this system, it is possible to obtain a magnetic resonance image of at least one of the aforementioned two substances for a very small period of time.

A magnetic resonance imaging system according to another embodiment of the present invention includes a correction section adapted to correct an influence from the inhomogeneities of the magnetic field in the acquiring process of all magnetic resonance data by the data pick-up section which is necessary to reconstruct a slice image, whereby it is possible to achieve the ultra high-speed imaging of the two substances as their separate images, while correcting any influence from the inhomogeneities of the static field.

In the magnetic resonance imaging system of the present invention, it is also possible to obtain, in a very small period of time, an image, such as a water/fat-separated image, corresponding to the nuclear magnetization density of two predetermined substances somewhat differing in their magnetic resonance frequency due to the chemical shift.

The system equipped with the correction section can eliminate any influence from a phase dispersion of the magnetization resulting from the inhomogeneities of the static field. It is also possible to correct a phase encode error which is caused by the use of a weaker gradient magnetization (for phase encode) in the ultra high-speed imaging process. This it is possible to gain a correct separated image free from any chemical shift artifact and deformation and hence to achieve the imaging of the aforementioned two substances as a separate image on an active site, such as the heart and circulatory system.

BRIEF DESCRIPTION OF THE DRAWINGS

FIG. 4 is a block diagram showing an arrangement of a magnetic resonance imaging system according to a first embodiment of the present invention;

FIG. 5 is a timing chart showing, by way of example, a pulse sequence for acquiring magnetic resonance data in the embodiment of FIG. 4;

FIG. 6 is a diagram for explaining the embodiment shown in FIG. 4;

FIG. 7 is a block diagram showing an arrangement of a magnetic resonance imaging system according to a second embodiment of the present invention;

FIG. 12 is a timing chart showing a pulse sequence for measuring the inhomogeneities of the static field.

DETAILED DESCRIPTION OF THE PREFERRED EMBODIMENTS

Figure 1:
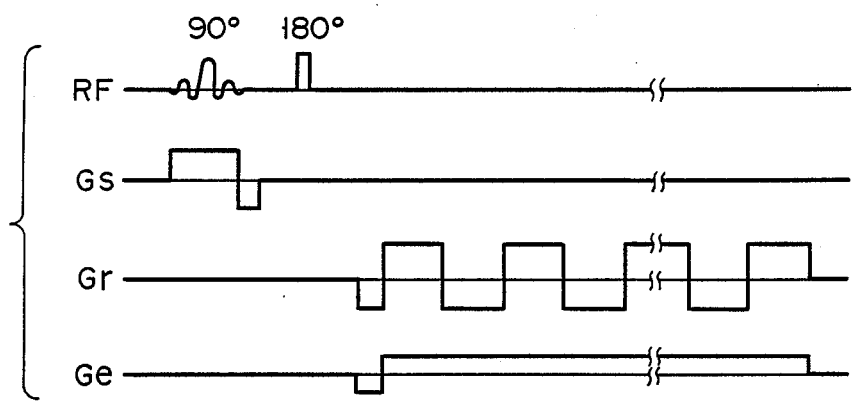
FIG. 1 is a timing chart showing a pulse sequence of a conventional echo planar method.

FIG. 4 shows an arrangement of a magnetic resonance imaging system according to a first embodiment of the present invention. FIG. 5 shows one form of a sequence of a ultra high-speed water/fat-separated imaging on the embodiment of the present invention. This embodiment adopts an echo planar method as an ultra high-speed imaging sequence.

In FIG. 4, static field magnet 1 having a static field coil system is driven by excitation power supply 2 and gradient field coil 3 is driven by gradient field drive circuits 4, 5 and 6 which in turn are controlled by gradient field controller 7. Static field magnet 1 applies a homogeneous static field to an object P (for example, a human subject or a patient) usually lying on a couch. Gradient field coil 3 generates a gradient field having a magnetic field distribution of a gradually varying field strength along two right-angled intersecting directions x and y in a slice, that is, an object cross-sectional portion of interest, and along a direction z perpendicular to the slice plane. In the embodiment as will be set forth below, the z-, x- and y-direction gradient fields are assumed as being a slicing gradient field Gs, read-out gradient field Gr and phase encode gradient field Ge, respectively.

A high frequency field which is generated from probe 9 by a high frequency signal of transmitting section 8 is applied to the object P. Transmitting section 8 is operated under control of pulse sequencer 10.

In this embodiment, probe 9 which is formed of a high frequency coil is commonly employed for a transmitting coil for the generation of a high frequency field and for a receiving coil for receiving a magnetic resonance signal relating to the nuclei of various atoms in the object. To this end, duplexer 12 is provided which is connected between probe 9 and transmitting section 8 and receiving processor section 11.

In place of the above arrangement, use may be made of two separate coils, one for transmit only and one for receive only. In this case, duplexer 12 is not necessary and the transmit- and receive-only coils are connected to transmitting section 8 and receiving processor section 11, respectively.

A magnetic resonance signal, that is, a magnetic resonance echo signal, which is received by probe 9 is amplified, detected, and picked up, as magnetic resonance echo data, by means of receiving processor section 11. The picked-up magnetic resonance echo data is, after being analog/digital (A/D) converted, supplied to computer 13.

Computer 13 receives the magnetic resonance echo data from receiving processor section 11 and subjects the echo data to a Fourier transform processing to achieve an image reconstruction as image data. Computer 13 controls pulse sequencer 10 via interface 14. Pulse sequencer 10 controls gradient field controller 7 and transmitting section 8. If necessary, power supply 2 and receiving processor section 11 are controlled by means of pulse sequencer 10. The image data which is obtained from computer 11 is supplied to display 14 where an image is displayed.

A nuclear spin which is excited by a 90° selection excitation pulse into magnetic resonance causes a phase dispersion in accordance with a time constant $T2^*$. However, the phase-dispersed nuclear spin is refocused by a 180° pulse which is applied a time TE/2 after the application of the 90° pulse and an echo is produced after TE/2. In this case, the nuclear spin of $^1H$ in the water and fat has the same phase on the rotation coordinate system. Here, the read-out gradient field Gr is repeatedly inversion-switched to produce a multi-echo, and during this period of time, the encode gradient field Ge of a predetermined amplitude is applied to the object P. This is what is called an ordinary echo planar method. There is a slight difference between the resonance frequencies of nuclei of $^1H$ in the water and fat and hence a Fourier-transformed reconstruction image contains a chemical shift artifact, that is, a positional displacement between the water and fat portions.

According to the present invention, use is made of the so-called modified Dixon method whereby a time from the excitation of the nuclear spin to the start of data acquisition is so adjusted as to have a phase difference of 90° between the magnetic resonance signals in the water and fat. That is, as shown in FIG. 5, the timing of applying a 180° pulse to the object P is changed from TE/2 to TE′/2 so that echo occurs a time TE′ after the application of a 90° selection excitation pulse. Since data acquisition is started a time TE after the application of the 90° pulse, a phase difference $\Delta\theta$ is given by that difference $\Delta T$ to the resonance signals of the nuclei of $^1H$ in the water and fat.

$$\Delta\theta = \Delta\omega \cdot \Delta T$$

Here $\Delta\omega$ represents a difference of the resonance frequencies of the nuclei of $^1H$ in the water and fat, noting that the fat is about 3 to 4 ppm lower than the water. By properly adjusting TE/2, a 90° phase difference can be imparted to the resonance signals of $^1H$ in the water and fat. If an image is reconstructed by Fourier transforming the magnetic resonance data thus obtained, a water/fat-separated image can be obtained in which case the water image emerges at a real part and the fat image at an imaginary part.

The following is a pulse sequence for obtaining the image data of the water/fat-separated image of the object's slice in accordance with the present invention. The pulse sequence is controlled by pulse sequencer 10.

The pulse sequence as shown in FIG. 5 is basically the same as that of the conventional echo planar method shown in FIG. 1.

First, in order to selectively excite the magnetization of the object's slice of interest, the slicing gradient field Gs is applied in the direction z and, in this state, a 90° selective excitation pulse (a high frequency pulse for 90°-flipping only the magnetization of the object's slice of interest) is applied, causing the predetermined nuclear magnetization of a specific slice of the object to be selectively excited to generate magnetic resonance. In this connection, the gradient field Gs for slice is inverted, after the application of the 90° selective excitation pulse, so as to refocus a magnetization. In this way, a 180° pulse is applied as a high frequency field RF after the application of the 90° selective excitation pulse and gradient field for slice, that is, a time TE′/2 after the application of the 90° selective excitation pulse. A magnetic resonance echo signal's peak is generated a time TE′/2 from the application of a 180° pulse, and a read-out gradient field Gr of the direction x and encode gradient field Ge of the direction y are applied after the time $\Delta T$ to sequentially produce a plurality of magnetic resonance echoes. That is, the read-out gradient field Gr is alternately switched, in the positive and negative alternate fashion, in one direction (for example, the direction x) on an x,y plane and, at the same time, the phase encode gradient field Ge is statically applied in the other direction, that is, the direction y, on the x,y plane during the time period in which the readout gradient field Gr is repetitively applied in the positive and negative alternate fashion. By so doing, a train of magnetic resonance echo signals is acquired from the object P and then Fourier-transformed to achieve an image reconstruction so that it is possible to obtain the image data of the slice.

In this way, the whole magnetic resonance data of the slice is acquired during the time T2* in which the magnetization in the slice plane excited by the 90° high frequency pulse and refocused by the 180° pulse to be relaxed due to the relaxation of the transverse magnetization containing an inhomogeneities of the static field.

From the pulse sequence of FIG. 5 the magnetic resonance echo signal is picked up with the use of a pulse sequence, including only the high frequency field RF and gradient field Gs and not including the read-out gradient field Gr and encode gradient field Ge, and then subjected to a one-dimensional Fourier transformation to obtain a water/fat spectrum. As shown in FIG. 6, at $\Delta T=0$, the water/fat spectrum is obtained as a "real-part" spectrum of the same sign, noting that the water spectrum $SP_W$ and fat spectrum $SP_f$ are indicated by the solid and broken lines, respectively. It is only necessary that, with the proper adjustment of $\Delta T$ from that state, the fat spectrum SPf emerge as an imaginary part as indicated by the solid line in FIG. 6. At $\Delta T>0$, since the magnetic resonance signals of the water and fat are inverted in their sign, the sign of the fat image is inverted upon the reconstruction of an image. When adjustment is made to be set to $\Delta T=0$, the water and fat-separated signal is obtained with the same sign.

The water/fat-separated image thus obtained may be displayed individually independently or as a water/fat-combined image. In this case, the position of the water/fat image is displaced due to a difference in their resonance frequency and that image is reconstructed after being adjusted properly. At this time, the images of the water and fat may be displayed in a different color.

The value $\Delta T$ for imparting a phase difference to the magnetic resonance signals of the nuclei of H in the water and fat need not necessarily be adjusted by the 180° pulse and may be obtained simply adjusting the data pick-up timing, that is, the read-out gradient field, encode gradient field and data acquisition timing or selective excitation pulse.

The sequence for picking up the magnetic resonance echo may not be obtained from the echo planar method and may be any sequence so long as it is a sequence for ultra high-speed imaging. For example, it is possible to use the sequence of the ultra high-speed Fourier method for applying an encode gradient field in a pulse-like fashion at the time of switching a read-out gradient field. Furthermore, the 180° pulse is not necessarily required and it may be possible to pick up the data of a free induction decay (FID) signal subsequent to the application of the 90° selection excitation pulse. In this case, the adjustment of the $\Delta T$ is conducted during a period of time from the application of the 90° selection excitation pulse to the picking-up of associated data.

The first embodiment of the present invention is tantamount to, so to speak, the application of the ultra high-speed imaging method to the modified Dixon method. As already set forth above, the conventional ultra high-speed imaging method poses a problem, such as the degradation of a high-speed characteristic because of the requirement of the refocusing process of a phase-dispersed magnetization resulting from the inhomogeneities of the static field or the occurrence of a phase encode error due to a static field and consequent degradation of a reconstructed image. In order to obtain, as in the modified Dixon method, an image of two substances whose resonance frequencies somewhat differ due to a chemical shift involved, an image quality is greatly affected by an error, such as a spatial phase error resulting from the inhomogeneities of the static field.

A magnetic resonance imaging system according to a second embodiment of the present invention is directed to solving the aforementioned problem. According to the present invention, a separated substance/substance image, that is, an image of two kinds of substances whose resonance frequencies somewhat differ due to a chemical shift, can be obtained in an ultra high-speed imaging process in comparison with the conventional system and in a high quality free from any adverse effect from the inhomogeneous static field.

FIG. 7 is a view showing an arrangement of a magnetic resonance imaging system according to the second embodiment of the present invention.

In FIG. 7, static field magnet 101 and gradient field coil 103 are driven by excitation power supply 102 and driver circuit 104, respectively, which are in turn controlled by systems controller 110. Static field magnet 101 applies a homogeneous static field to an object P on couch 106. Gradient field coil 103 applies a gradient field having a magnetic intensity distribution of a gradually varying intensity along two directions x and y intersecting at right angles in a cross-section of interest of the object P, that is, a slice plane, and direction z perpendicular to the slice plane. Even in this embodiment, an explanation will be given below with the z-direction gradient field, x-direction gradient field and y-direction gradient field as a slicing gradient field Gs, read-out gradient field Gr and phase encode gradient field Ge, respectively.

A high frequency magnetic field, which is generated from probe 107 by a high frequency signal from transmitter 108, is applied to the object P. Transmitter 108 is operated under control of system controller 110. Although, in the present embodiment, probe 107 is commonly employed for a transmitting coil for the generation of a high frequency-magnetic field and receiving coil for the reception of a magnetic resonance signal relating to various types of the nuclei of atoms in the object P, transmit- and receive-only coils may separately be provided as in the same way as in the first embodiment of the present invention.

A magnetic resonance signal, that is, a magnetic resonance echo signal, which is received by probe 107, is transferred to data acquisition section 111 after being amplified and detected by receiver 109. The transfer of the data is effected under control of system controller 110. Data acquisition section 111, which is controlled by system controller 110, acquires a magnetic resonance echo signal from receiver 109 and subjects it to an A/D conversion, and send it to computer 112.

Computer 112 is controlled by an operation via console 113 and it subjects the magnetic resonance echo data which is input from data acquisition section 111 to a Fourier transformation and hence an image reconstruction processing to obtain image data. Computer 112 also controls system controller 110 and the image data of computer 112 is supplied to image display 114 where the image is displayed.

Figure 8:
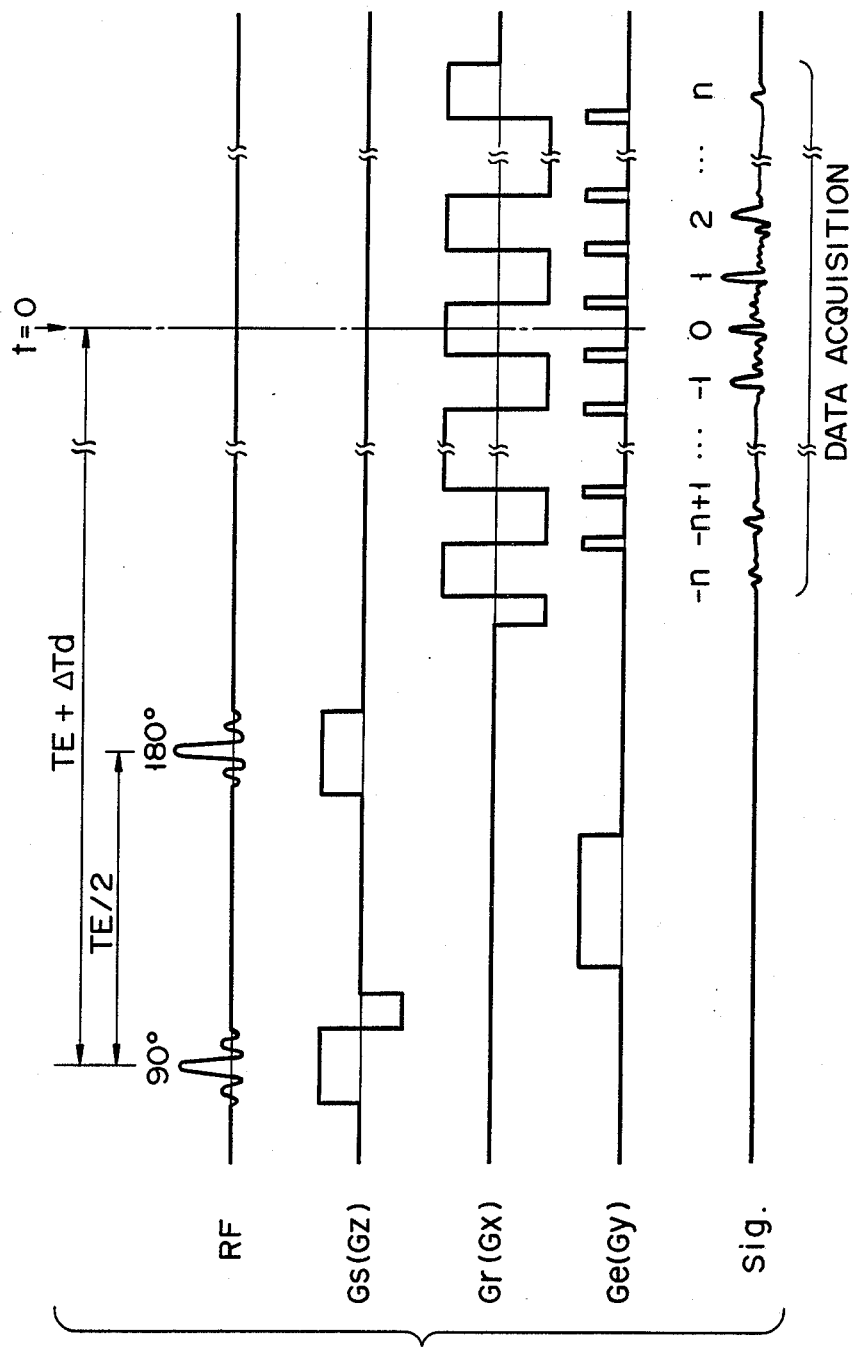
FIG. 8 is a timing chart showing a pulse sequence for picking up magnetic resonance data in the embodiment shown in FIG. 7.

FIG. 8 shows one form of a pulse sequence for obtaining a water/fat-separated image data relating to a slice of an object P in accordance with the present invention. The pulse sequence is controlled by system controller 110.

Figure 2:
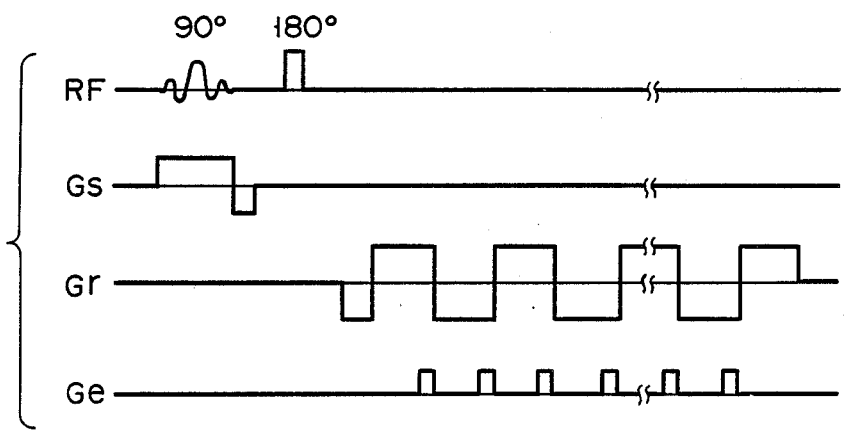
FIG. 2 is a timing chart showing a pulse sequence of a conventional ultra high-speed Fourier transform method.
Figure 3A:
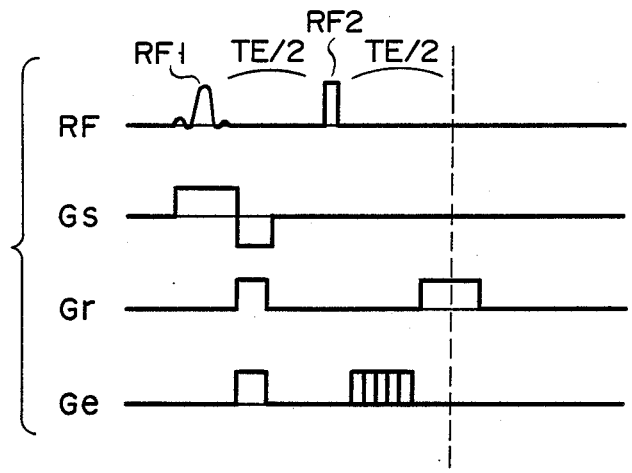
FIGS. 3A and 3B are timing charts for explaining a pulse sequence of a conventional Dixon method.
Figure 3B:
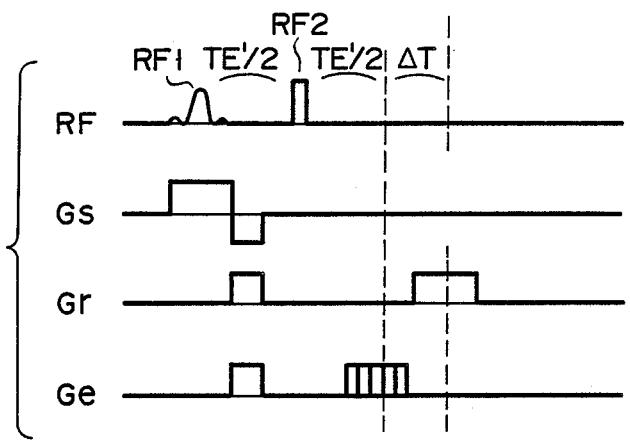

The pulse sequence of FIG. 8 is fundamentally based on that of the conventional ultra high-speed Fourier method of FIG. 2, but is different from the latter in that the gradient field Ge for phase encode is applied before the application of a 180° high frequency pulse following the application of a 90° selective excitation pulse, that a selective excitation pulse is used as a 180° high frequency pulse, and that the 180° selective excitation high frequency pulse is employed with the slicing gradient field Gs applied.

That is, first in order to selectively excite the magnetization of a slice plane of interest of the object P, a slicing gradient field Gs is applied in the direction z and, in this state, a 90° selective excitation pulse (a high frequency pulse for 90° flipping the magnetization of a predetermined slice of interest) is applied as a high frequency field RF, causing a selective excitation of a predetermined nuclear magnetization of the predetermined slice plane of interest of the object P. After the application of the 90° selective excitation pulse, the gradient field Gs is inverted to refocus a magnetization.

After the application of the 90° selective excitation pulse and slicing gradient field Gs, gradient field Ge phase encode is applied in the direction y. A time TE/2 after the application of the 90° selective excitation pulse, a 180° selective excitation pulse is applied as a high frequency magnetic field RF, while, at the same time, the slicing gradient field Gs is being applied. In the pulse sequence of FIG. 2, the magnetic resonance echo signal is produced a time TE/2 after the application of the 180° pulse, while in the pulse sequence of FIG. 8 an x-direction read-out gradient field Gr and y-direction gradient field Ge are applied without a wait for a lapse of a time TE/2 following the application of the 180° pulse to sequentially produce -n-th to n-th magnetic resonance echoes. That is, in one direction of the x and y plane intersecting at right angles to the z direction, for example, the x direction, the gradient field Gr are repetitively applied in a positive and negative alternate switching fashion and, in the other direction of the x and y plane, for example, the y-direction, the gradient field Ge for phase encode is applied in a pulse-like fashion for each inversion of the read-out gradient field. If this is done, it is possible to pick up -n-th to n-th magnetic resonance echo signals from within the object P. In this case, the timing of read-out gradient field Gr and gradient field Ge for phase encoding are adjusted so that the center of O-th echo signal becomes a time $TE + \Delta Td$ after the application of the 90° selective excitation pulse ($\Delta Td$: an amount of time shift based on the modified Dixon method). The echo signal train is Fourier-transformed and image-reconstructed to generate the image data of the slice.

According to the present invention, within a time $T2^*$ when the magnetization in the slice plane as excited by the 90° high frequency pulse and refocused by the 180° pulse is relaxed due to the relaxation of a transverse magnetization containing an inhomogeneities of the static field, all the magnetic resonance data on the slice are picked up and, since the center of O-th echo signal are picked up at the time $TE + \Delta Td$ after the application of the 90° selective excitation pulse, it is thus possible to provide a water/fat-separated image at a higher speed than that in the pulse sequence shown in FIG. 2.

In the pulse sequence of the ultra high-speed water/fat-separated imaging system as shown in FIG. 8, an echo signal S(t) as observed in the presence of the spatial inhomogeneous static field is given by:

$$S(t) = A \cdot \exp(-1/T2) \times \qquad (1)$$
$$\int\int [\rho w(x,y) + \rho f(x,y) \cdot \exp\{-i\Delta\omega c(\Delta Td + t)\}] \times$$
$$\exp(-i\gamma\Delta H(x,y)\Delta Td) \times$$
$$\exp[-i\gamma\{(Gx \cdot x \cdot \Psi(t) + Gy \cdot y \cdot (t) + \Delta H(x,y)t\}]dxdy$$

noting $Gx = NGy - M$ (read-out direction) $\times$ N (encode direction) matrix where T2: a transverse relaxation time;

$\rho w(x,y)$ and $\rho f(x,y)$: the density distribution of a nuclear spin in the water and fat of the sample;

$\Delta\omega c$: The angular frequency of the chemical shift of the water and fat;

$\Delta Td$: the amount of time shift based on the modified Dixon method in which case $(4n\pm1)/4fc$ if $fc$=the chemical shift frequency of the fat;

$\gamma$: the nuclear gyromagnetic ratio;

$\Delta H(x,y)$: the inhomogeneous distribution of the static field;

Gx and Gy: the intensities of the read-out and phase encode gradient fields;

$\Psi(t)$: the integral function of the read-out gradient field applying time; and $\Xi(t)$: the integral function of the phase encode gradient field applying time.

Here $$\gamma Gx \cdot x \cdot \Psi(t) >> \gamma \cdot \Delta H(x,y)t, \ \Delta\omega ct \quad (\Delta T) = \int_0^{\Delta T} t\,dt$$

Equation (1) approximates to:

$$S(t) \simeq A \cdot \exp(-t/T2) \times \qquad (2)$$
$$\int\int \rho w(x,y) \cdot \exp(-i\gamma\Delta H(x,y)\Delta Td) \times$$
$$\exp[-i\gamma\{(Gx \cdot x \cdot \Psi(t) +$$
$$Gy \cdot (y + \Delta H(x,y)/Gy) \ (t)\}]dxdy +$$
$$A \cdot \exp(-t/T2) \times$$
$$\int\int \rho f(x,y) \cdot \exp\{-i(\Delta\omega c + \gamma\Delta H(x,y)\Delta Td)\} \times$$
$$\exp[-i\gamma\{(Gx \cdot x \cdot \Psi(t) +$$
$$Gy \cdot (y + \Delta H(x,y)/Gy + \Delta\omega c/\gamma Gy) \ (t)\}]dxdy$$

Here T2 is given as $\infty$
If $\Delta\omega c \cdot \Delta Td = -\pi/2$
$kx = \gamma Gx\Psi(t)$
$ky = \gamma Gx\Psi(t)$,
then Equation (2) is reduced to:

$$S(kx,ky) = \int\int [\rho w(x,y) + \rho f(x,y) \times \quad (3)$$
$$\exp\{-i\Delta\omega c(\Delta Td + ky/\gamma Gy)\}] \times$$
$$\exp(-i\gamma\Delta H(x,y)\Delta Td) \times$$
$$\exp[-i\{xkx + (y+\Delta H(x,y)/Gy)ky\}]dxdy$$

Here,
x′ = x
y′ = y + ΔH(x,y)/Gy
If this is the case, then a reconstruction image is given by:

$$\rho(x',y') = \rho r(x',y') + i\rho i(x',y')$$
$$= \{\rho w(x,y) + i\rho f(x,y - \Delta\omega c/\gamma Gy)\} \times$$
$$J(x,y)\exp(-i\gamma\Delta(x,y) \cdot \Delta Td)$$

, provided that J(x,y) is Jacobian.

$$\begin{pmatrix} \rho w(x,y) \\ \rho f(x,y - \Delta\omega c/\gamma Gy) \end{pmatrix} = \quad (5)$$

$$J(x,y) \cdot \frac{1}{\Delta} \begin{pmatrix} \cos\theta 2 & \sin\theta 2 \\ -\sin\theta 1 & \cos\theta 1 \end{pmatrix} \begin{pmatrix} \rho r(x',y') \\ \rho i(x',y') \end{pmatrix}$$

Here
Δ = cosθ1cosθ2 + sinθ1sinθ2
θ1 = γΔH(x,y)ΔTd
θ2 = γΔH(x,y − Δωc/γGy)ΔTd

Measuring the distribution of the inhomogeneities ΔH(x,y) of the static field initially, it is possible to find correct water/fat-separated image data, free from the effect of the inhomogeneous static field, from Equation (5), with the use of ΔH(x,y) and image data as picked up by the sequence of FIG. 2.

Figures 9, 10:
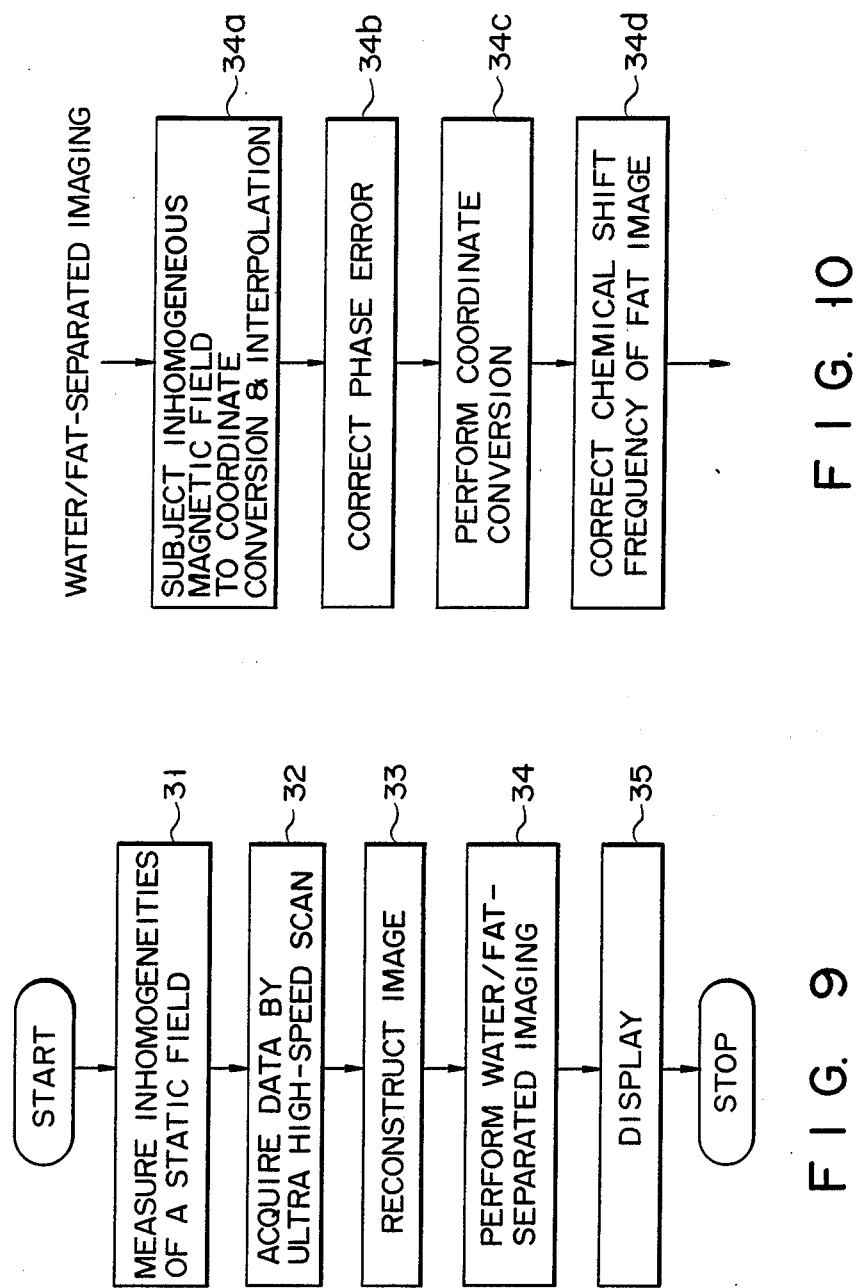
FIGS. 9 and 10 are flow charts for showing a flow of a water/fat-separated image processing including a process for correcting an influence resulting from the inhomogeneities of a static field in the embodiment of FIG. 7.

FIGS. 9 and 10 show a flow of processing for obtaining a water/fat-separated image in accordance with the present invention with an effect of an inhomogeneous static field corrected.

First, measurement is made, at step 31, of the inhomogeneities ΔH(x,y) of the static field. The way of measuring the inhomogeneity of the static field has been proposed by, for example, Maudsley et al. FIG. 12 shows a pulse sequence for measuring the inhomogeneities of the static image field. The slice's nuclear spin is selectively excited by a selective excitation pulse and z direction gradient field Gz (that is, Gs). Then the x and y direction gradient fields Gx and Gy are applied so as to incorporate the x and y direction positional information in the excited slice plane into the phase of the nuclear spin. The subsequent application of a 180° pulse results in the generation of a spin echo signal. An observation is made of those echo signals which are generated by repeating the sequence while sequentially varying the amplitudes of the gradient fields Gx and Gy. If a three-dimensional data train thus obtained is subjected to a three-dimensional Fourier transformation, the information of the magnetic intensity at the respective positions within the slice plane is obtained as a spectrum's frequency difference. As the magnetic field measuring method, other methods, in addition to the aforementioned methods, have been proposed, such as a method employing an FID signal and method finding a magnetic field distribution from the spin's phase information. In the present invention, use may be made of not only either of these methods but also other proper methods. The measurement may be made for the respective imaging or, subsequent to making one initial measurement, the result of measurement may be repeated for each imaging operation.

Then the data of the magnetic resonance echo signal S(t) is acquired at step 32 with the use of the pulse sequence upon an ultra high-speed scan and then the acquired data is subjected at step 33 to the Fourier transformation and hence an image reconstruction processing.

For the result of the image reconstruction, the imaging processing is carried out, at step 34, for obtaining a water/fat-separated image, the processing including the processing for correcting an effect resulting from the inhomogeneities of the static field.

The water/fat-separated imaging step 34 comprises, as shown in FIG. 10, a step 34a for subjecting the inhomogeneous field distribution to a coordinate conversion and interpolation, step 34b for correcting a phase error resulting from the inhomogeneous magnetic field, coordinate conversion step 34c and step 34d for correcting an image shift resulting from the chemical shift frequency of the fat image.

The results of image reconstructions thus performed are displayed on the image display at step 35.

Figure 11:
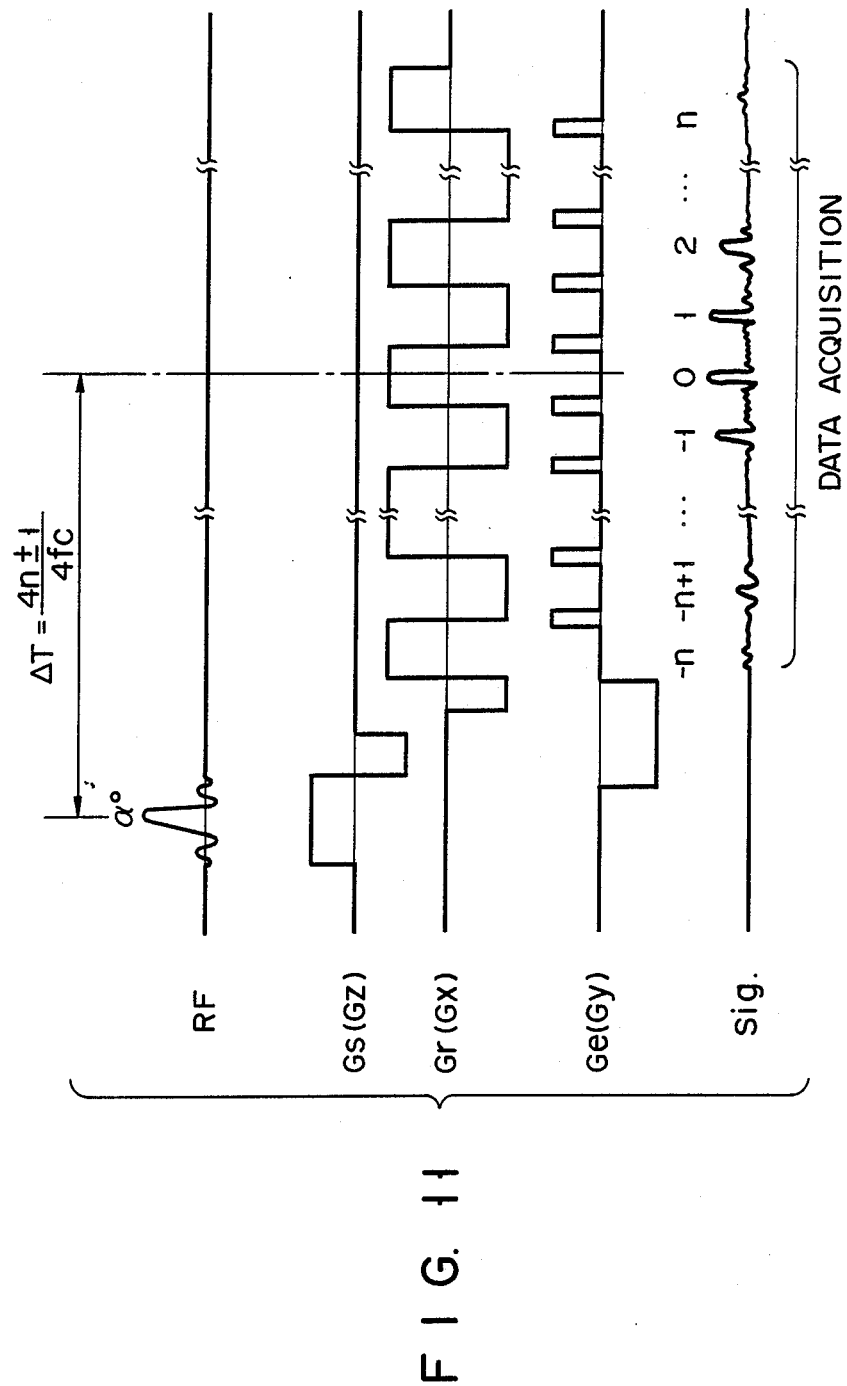
FIG. 11 is a view showing another pulse sequence for picking up image data in accordance with the present invention.

The present invention is not restricted to the aforementioned embodiments. Although in the aforementioned embodiment the 180° pulse has been explained as being applied subsequent to the application of the 90° selective excitation pulse, subsequent to exciting the magnetization in the slice plane by an α° (90° for instance) selective excitation pulse and gradient field Gs the switching of the read-out gradient field Gr and pulsatory application of the gradient field Ge may be performed (without the application of the 180° pulse as shown in FIG. 8), as shown in FIG. 11, to achieve high-speed imaging. The use of such a pulse sequence allows correction of a magnetization phase dispersion caused by the effect of the static field inhomogeneities resulting from the absence of the 180° high frequency pulse and hence the correction of a phase encode error resulting from the effect from the inhomogeneities of the static field.

A pulse sequence as shown in FIG. 11 eliminates the need for simultaneously applying a 180° pulse and gradient field Gs as in the pulse sequence shown in FIG. 8. That is, in order to selectively excite the magnetization in a slice plane of interest of the object P, the application of the gradient field Gs in the z-direction and that of a 90° selective excitation pulse (an angle α° other than 90° may be used) are effected to selectively excite a specific slice in the object P in which case the gradient field Gs is, subsequent to the application of the 90° selective excitation pulse, inverted so that a magnetization may be refocused.

Subsequent to applying the 90° pulse and gradient field Gs, a read-out gradient field Gr is repetitively applied in a positive and negative alternate switching fashion in one direction of an x,y plane intersecting at right angles to the z direction, for example, in the x direction, without applying the 180° pulse and gradient field Gs as shown in FIG. 8, and, at the same time, a gradient field Ge is applied in a pulse-like fashion in the other direction of the x,y plane, for example, in the y direction each time the read-out gradient field Gr is inverted. By so doing, it is possible to obtain a magnetic resonance signal (an echo signal) from within the object P as in substantially the same fashion as in FIG. 8.

According to this pulse sequence, since the application of the 180° pulse as shown in FIG. 8, is omitted, it is possible to obtain a higher speed imaging than in the pulse sequence of FIG. 8.

In this case, no magnetization phase dispersion due to the relaxation time T2* as set out above occurs if a time at which magnetic resonance data is picked up a predetermined time after the magnetization in the slice is excited by a 90° high frequency pulse for selective excitation is set to just zero. In actual practice, however, it is difficult to set the aforementioned predetermined time to zero. In this case, the effect of the magnetization phase dispersion resulting from the aforementioned relaxation T2* is corrected.

The present invention is not restricted to the aforementioned embodiments. Although the present invention has been explained as using the ultra high-speed Fourier transform method, it can use the echo planar method shown in FIG. 1. In this case, instead of repeatedly applying the gradient field Ge in a pulse-like fashion each time the read-out gradient field Gr is inverted, the gradient field Ge for phase encode is statically applied during all the time in which the read-out gradient field Gr is applied while being inverted.

The present invention can variously be changed or modified without departing from the spirit and scope of the present invention.

What is claimed is:

1. A magnetic resonance imaging system for imaging magnetic resonance signals detected from within an object by applying a high frequency field and gradient field to the object in a homogeneous static field in accordance with a predetermined sequence, comprising:
   data pick-up means which, with the use of a predetermined pulse sequence so time-adjusted that a nuclear magnetization phase difference between two predetermined types of substances somewhat differing in their magnetic resonance frequencies due to a chemical shift is $\pi/2$ or $-\pi/2$ on a predetermined time, acquires all magnetic resonance data necessary for reconstruction of an image of a slice excited by said high frequency field into magnetic resonance within a time period in which the predetermined nuclear magnetization of the slice is relaxed due to the relaxation of a transverse magnetization, said predetermined time being a data pick-up time at which a read-out gradient field integral function and phase encode gradient integral function are both zero in a predetermined pulse sequence; and
   image processing means for obtaining a magnetic resonance image of at least one of said two substances separated into real and imaginary parts by subjecting magnetic resonance data acquired by said data pick-up means to a two-dimensional complex Fourier transformation.

2. The system according to claim 1, in which said data pick-up means is means for acquiring all data necessary for the image reconstruction of a slice plane in a sequence which applies a slicing gradient field perpendicular to said slice and 90° high frequency pulse excited into nuclear magnetization to allow the predetermined slice to be excited into magnetic resonance and applies a read-out gradient field of a direction intersecting at right angles to the slicing gradient field in a positive and negative alternate switching fashion after a 180° high frequency pulse has been applied, while at the same time applying a phase encode gradient field intersecting at right angles to the slicing gradient field and read-out gradient field.

3. The system according to claim 2, in which said data pick-up means applies said phase encode gradient field in a pulse-like fashion when said read-out gradient field is inverted.

4. The system according to claim 2, in which said data pick-up means statically applies said phase encode gradient field during all the time in which said readout gradient field is being applied in a positive and negative alternate switching fashion.

5. The system according to claim 1, in which said image processing means includes a synthesizing means for synthesizing magnetic resonance images of said two substances to obtain a substance/substance-combined image.

6. The system according to claim 5, in which said synthesizing means includes means for correcting a displacement resulting from a difference between the resonance frequencies of said two substances in said two synthesized images.

7. A magnetic resonance imaging system for imaging magnetic resonance signals detected from within an object by applying a high frequency field and gradient field to the object in a homogeneous static field in accordance with a predetermined sequence, comprising:
   data pick-up means which, with the use of a predetermined pulse sequence so time-adjusted that a nuclear magnetization phase difference between two predetermined types of substances somewhat differing in their magnetic resonance frequencies due to a chemical shift is $\pi/2$ or $-\pi/2$ in a predetermined time, acquires all magnetic resonance data necessary for reconstruction of an image of a slice excited by said high frequency field into magnetic resonance within a time period in which the predetermined nuclear magnetization of the slice is relaxed due to the relaxation of a transverse magnetization, said predetermined time being a data pick-up time at which a read-out gradient field integral function and phase encode gradient integral function are both zero in a predetermined pulse sequence;
   image processing means for obtaining a magnetic resonance image of at least one of said two substances in a form separated into real and imaginary parts by subjecting magnetic resonance data acquired by said data pick-up means to a two-dimensional complex Fourier transformation; and
   means for correcting an effect of inhomogeneities of said magnetic field in a process in which all magnetic resonance data necessary for reconstruction of the image of the slice are acquired by said data pickup means.

8. The system according to claim 7, in which said correcting means is means for correcting at least one of a correction relating to a separation of said two predetermined substances somewhat differing in their magnetic resonance frequency due to said chemical shift and a correction relating to an image deformation.

9. The system according to claim 7, in which said correcting means corrects real- or imaginary-part image obtained by said two-dimension complex Fourier transformation, with the use of distribution information of inhomogeneities of a static field in the slice.

10. The system according to claim 7, in which said data pick-up means acquires all data necessary for reconstruction of an image of a slice plane, in a pulse sequence which applies a slice gradient field of a direction perpendicular to said slice plane and high frequency pulse for excitation into nuclear magnetization to excite a predetermined slice into nuclear resonance and applies a read-out gradient field of a direction intersecting at right angles to the slice gradient field in a high-speed positive and negative alternate switching fashion while applying a phase encode gradient field of a direction intersecting at right angles to said slice gradient field and said readout gradient field.

11. The system according to claim 10, in which said data pick-up means acquires all data necessary for reconstruction of an image of a slice plane, in a pulse sequence which applies a slice gradient field of a direction perpendicular to the slice and a 90° high frequency pulse for excitation into nuclear magnetization to allow a predetermined slice to be excited into magnetic resonance and applies a read-out gradient field of a direction intersecting at right angles to the slice gradient field in a high-speed positive and negative alternate switching fashion while applying a phase encode gradient field of a direction intersecting at right angles to said slice gradient field and read-out gradient field.

12. The system according to claim 11, in which said correcting means includes means for correcting an effect of a magnetization phase dispersion caused by inhomogeneities of a static field subsequent to applying said 90° high frequency pulse.

13. The system according to claim 10, in which said data pick-up means acquires all data necessary for reconstruction of an image of a slice plane, in a phase sequence Which applies a slice gradient field of a direction perpendicular to the slice plane and 90° high frequency pulse for excitation into said predetermined nuclear magnetization to allow a predetermined slice to be excited into magnetic resonance and, subsequent to applying a 180° high frequency pulse, applies a read-out gradient field of a direction intersecting at right angles to the slice gradient field in a high-speed positive and negative alternate switching fashion while applying a phase encode gradient field of a direction intersecting at right angles to the slice gradient field and read-out gradient field.

14. The system according to claim 13, in which said data pick-up means applies said phase encode gradient field in a pulse-like fashion each time said read-out gradient field is inverted.

15. The system according to claim 13, in which said pick-up means statically applies said phase encode gradient field during all the time in which said read-out gradient field is being applied in a positive and negative alternate switching fashion.

16. A magnetic resonance imaging system for imaging magnetic resonance signals detected from within an object by applying a high frequency field and gradient field to the object in a homogeneous static field in accordance with a predetermined sequence, comprising:

data pick-up means which, with the use of a predetermined pulse sequence so time-adjusted that a nuclear magnetization phase difference between two predetermined types of substances somewhat differing in their magnetic resonance frequencies due to a chemical shift if $\pi/2$ or $-\pi/2$ on a predetermined time, acquires all magnetic resonance data necessary for reconstruction of an image of a slice excited by said high frequency field into magnetic resonance within a time period in which the predetermined nuclear magnetization of the slice is relaxed due to the relaxation of a transverse magnetization, said data pick-up means acquiring said all magnetic resonance data in a sequence which applies a slicing gradient field perpendicular to said slice and 90° high frequency pulse excited into nuclear magnetization to allow the predetermined slice to be excited into magnetic resonance and applies a read-out gradient field of a direction intersecting at right angles to the slicing gradient field in a positive and negative alternate switching fashion after a 180° high frequency pulse has been applied, while at the same time applying a phase encode gradient field intersecting at right angles to the slicing gradient field and read-out gradient field; and image processing means for obtaining a magnetic resonance image of at least one of said two substances separated into real and imaginary parts by subjecting magnetic resonance data acquired by the said data pickup means to a two-dimensional complex Fourier transformation.

17. The systems according to claim 16, in which said image processing means includes a synthesizing means for synthesizing magnetic resonance images of said two substances to obtain a substance/substance-combined image.

18. The system according to claim 17, in which said synthesizing means includes means for correcting a displacement resulting from a difference between the resonance frequencies of said two substances in said two synthesized images.

* * * * *